US012713599B2

(12) United States Patent
Yan et al.

(10) Patent No.: US 12,713,599 B2
(45) Date of Patent: Aug. 18, 2026

(54) THREE-DIMENSIONAL NAND MEMORY DEVICE WITH IMPROVED LEAKAGE CURRENT AND FABRICATION METHOD

(71) Applicant: Yangtze Memory Technologies Co., Ltd., Wuhan (CN)

(72) Inventors: Longxiang Yan, Wuhan (CN); Wei Xu, Wuhan (CN); Lei Xue, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 755 days.

(21) Appl. No.: 17/971,777

(22) Filed: Oct. 24, 2022

(65) Prior Publication Data

US 2024/0138148 A1 Apr. 25, 2024
US 2024/0237338 A9 Jul. 11, 2024

(51) Int. Cl.
*H10B 43/27* (2023.01)

(52) U.S. Cl.
CPC .................................... *H10B 43/27* (2023.02)

(58) Field of Classification Search
CPC . H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 2012/0140586 A1* | 6/2012 | Kim | ......................... | G11C 8/10 365/230.03 |
| 2013/0026496 A1* | 1/2013 | Yin | .................... | H10D 30/0413 257/77 |
| 2016/0293618 A1* | 10/2016 | Namkoong | ........ | H10D 30/6891 |
| 2025/0324593 A1* | 10/2025 | Wang | ..................... | H10B 43/27 |

FOREIGN PATENT DOCUMENTS

WO WO-2022233118 A1 * 11/2022 ............ H10B 43/27

* cited by examiner

*Primary Examiner* — William B Partridge
*Assistant Examiner* — Gustavo G Ramallo
(74) *Attorney, Agent, or Firm* — Anova Law Group, PLLC

(57) ABSTRACT

A method of forming a three-dimensional (3D) NAND memory device includes: forming a gate line slit through alternating layers of an oxide layer and a conductive material layer, wherein the conductive material layer is further formed on a sidewall and a bottom of the gate line slit; performing a first etch process to remove portions of the conductive material layer from the sidewall and the bottom of the gate line slit and from between adjacent oxide layers, thereby exposing portions of the oxide layer in the gate line slit; removing the exposed portions of the oxide layer on the sidewall of the gate line slit; and performing a second etch process to remove residues of the conductive material layer in the gate line slit.

16 Claims, 17 Drawing Sheets

100
121
141
142
140
Z
Y
110

THREE-DIMENSIONAL NAND MEMORY DEVICE WITH IMPROVED LEAKAGE CURRENT AND FABRICATION METHOD

TECHNICAL FIELD

The present disclosure relates to the technical field of integrated circuits (ICs) and, more particularly, to a method of forming a three-dimensional (3D) NAND memory device and a 3D NAND memory device.

BACKGROUND

NAND memory is a non-volatile type of memory device that does not require power for retaining stored data. The growing demands of consumer electronics, cloud computing, and big data bring about a constant need of NAND memories of larger capacity and better performance. As conventional two-dimensional (2D) NAND memory device approaches its physical limits, three-dimensional (3D) NAND memory device is now playing an important role. The 3D NAND memory device uses multiple stacked layers in a single chip to achieve higher density, higher capacity, faster performance, lower power consumption, and better cost efficiency.

The 3D NAND memory device includes a substrate having a doped region, a layer stack, memory cells, a semiconductor layer, a contact structure, and gate line slit structures. The gate line slit structures are formed through the layer stack to separate the memory cells into blocks. After the gate line slit structures are formed, residue metals may remain on sidewalls of the gate line slit structures, causing leakage currents between adjacent memory cells. The present disclosure improves the process of forming the gate line slit to eliminate the leakage currents.

SUMMARY

One aspect of the present disclosure provides a method of forming a three-dimensional (3D) NAND memory device. The method includes: forming a gate line slit through alternating layers of an oxide layer and a conductive material layer, where the conductive material layer is further formed on a sidewall and a bottom of the gate line slit; performing a first etch process to remove portions of the conductive material layer from the sidewall and the bottom of the gate line slit and from between adjacent oxide layers, thereby exposing portions of the oxide layer in the gate line slit; removing the exposed portions of the oxide layer on the sidewall of the gate line slit; and performing a second etch process to remove residues of the conductive material layer in the gate line slit.

Another aspect of the present disclosure provides a three-dimensional (3D) NAND memory device. The 3D NAND memory device includes: alternating layers of an oxide layer and a conductive material layer formed on a semiconductor layer; memory cells formed in the alternating layers of the oxide layer and the conductive material layer; and gate line slit structures formed through the alternating layers to separate the memory cells into blocks, where the oxide layer of the alternating layers includes a first portion in contact with a dielectric material layer disposed between the oxide layer and an adjacent conductive material layer, and a second portion in contact with the gate line slit structures.

Another aspect of the present disclosure provides a memory system. The memory system includes a three-dimensional (3D) NAND memory device and a memory controller coupled to the 3D NAND memory device and configured to control operations of the 3D NAND memory device. The 3D NAND memory device includes: alternating layers of an oxide layer and a conductive material layer formed on the semiconductor layer; memory cells formed in the alternating layers of the oxide layer and the conductive material layer; and gate line slit structures formed through the alternating layers to separate the memory cells into blocks, where the oxide layer of the alternating layers includes a first portion in contact with a dielectric material layer disposed between the oxide layer and an adjacent conductive material layer, and a second portion in contact with the gate line slit structures.

BRIEF DESCRIPTION OF THE DRAWINGS

To more clearly illustrate the technical solution in embodiments of the present disclosure, the accompanying drawings used in the description of the disclosed embodiments are briefly described hereinafter. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Technical solutions in the embodiments of the present disclosure will be clearly described below with reference to the accompanying drawings. Although the accompanying drawings show exemplary implementation methods of the present disclosure, it should be understood that the present disclosure can be implemented in various forms and should not be limited by the embodiments set forth herein. On the contrary, the embodiments are provided to enable a more thorough understanding of the present disclosure and to fully convey the scope of the present disclosure to those skilled in the art.

In the following paragraphs, the present disclosure will be described in more detail with examples and with reference to the accompanying drawings. Advantages and features of the present disclosure will be apparent according to the description and the claims. It should be noted that the accompanying drawings all adopt a simplified form and use imprecise proportions. For convenience and clarity, the drawings are only used to assist in describing objectives of the embodiments of the present disclosure.

In the embodiments of the present disclosure, a sentence like "A and B are connected" includes situations where A and B are connected with each other and are in contact with each other or where A and B are connected through another component and without directly contacting with each other.

In the embodiments of the present disclosure, terms such as "first" and "second" are used to distinguish similar objects and are not necessarily used to describe a specific sequence or order.

In the embodiments of the present disclosure, a term "layer" refers to a material portion including a region having a thickness. A layer may extend over an entirety of a lower or upper structure, or may have a range smaller than that of the lower or upper structure. In addition, the layer may be a region of homogeneous or heterogeneous continuous structure having a thickness smaller than a thickness of the continuous structure. For example, the layer may be disposed between a top surface and a bottom surface of the continuous structure or may be disposed between two planes where the top surface and the bottom surface are located respectively. The layer may extend horizontally, vertically, and/or along an inclined surface. The layer may include a plurality of sub-layers.

It will be appreciated that the described embodiments are some rather than all of the embodiments of the present disclosure. Other embodiments obtained by those having ordinary skills in the art on the basis of the described embodiments without inventive efforts should fall within the scope of the present disclosure.

Embodiments of the present disclosure will be described in detail in connection with the drawings. Under circumstances of no conflict, the following embodiments and features in the embodiments may be combined with each other.

Figures 1, 2:
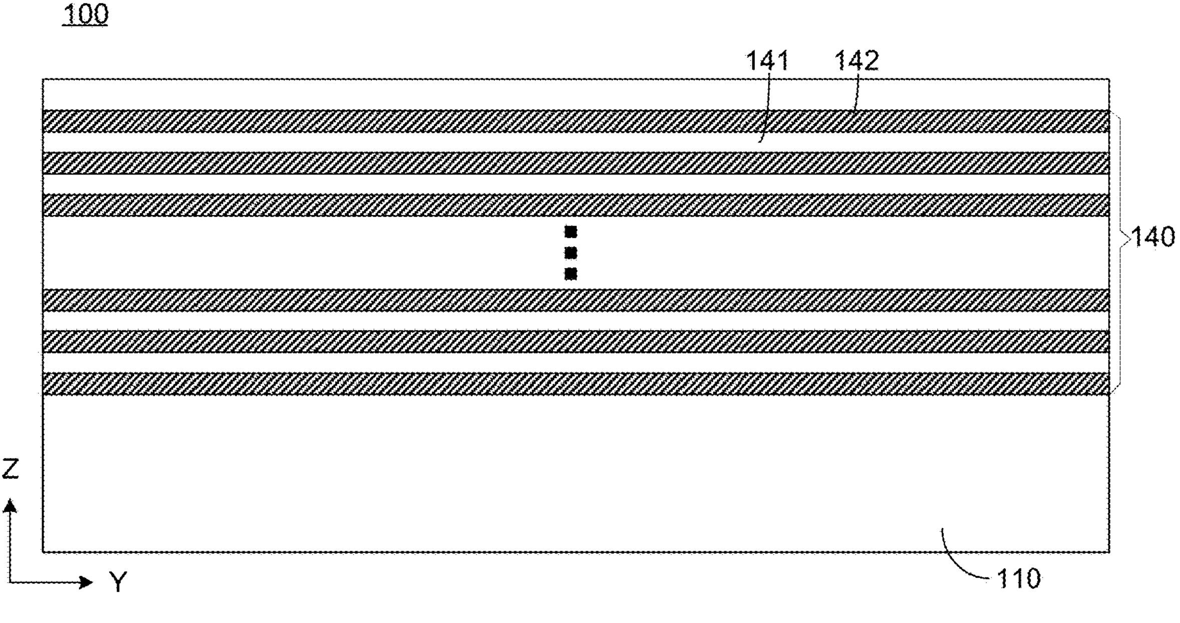
FIGS. 1-13, 14A-14B, and 15A-15B illustrate schematically cross-sectional views of a three-dimensional (3D) NAND memory device in different stages during its formation according to embodiments of the present disclosure.

FIGS. 1-9 schematically show a fabrication process of an exemplary 3D NAND memory device 100 according to embodiments of the present disclosure. As shown in FIGS. 1-9, cross-sectional views are illustrated in a Y-Z plane and/or a X-Z plane, and top views are in an X-Y plane. As shown in FIG. 1, the 3D NAND memory device 100 includes a substrate 110. In one embodiment, the substrate 110 may include a semiconductor layer.

In some embodiments, the substrate 110 may include a single crystalline silicon layer. In some other embodiments, the substrate 110 may include a semiconductor material, such as germanium (Ge), silicon-germanium (SiGe), silicon carbide (SiC), silicon-on-insulator (SOI), germanium-on-insulator (GOI), polysilicon, a Group III-V compound such as gallium arsenide (GaAs) or indium phosphide (InP), etc. In some other embodiments, the substrate 110 may include an electrically non-conductive material such as glass, a plastic material, or a ceramic material. As an example, the substrate 110 may include an undoped or lightly doped single crystalline silicon layer. In some other embodiments, the substrate 110 may be doped with p-type and/or n-type dopants. When the substrate 110 includes glass, plastic, or ceramic material, the substrate 110 may further include a thin layer of polysilicon deposited on the glass, plastic, or ceramic material. In this case, the substrate 110 may be processed similar to a polysilicon substrate.

In some embodiments, a top portion of the substrate 110 may be doped by n-type dopants via ion implantation and/or via diffusion to form a doped region (not shown). The dopants of the doped region may include, for example, phosphorus (P), arsenic (As), and/or antimony (Sb). A cover layer (not shown) may be deposited over the doped region. The cover layer may include a single layer, a multi-layer, and/or a suitable composite layer. For example, the cover layer may include silicon oxide layer and/or silicon nitride layer. The cover layer may be deposited by chemical vapor deposition (CVD), physical vapor deposition (PVD), atomic layer deposition (ALD), or a combination thereof. In some other embodiments, the cover layer may include another material such as aluminum oxide.

Over the cover layer, a sacrificial layer (not shown) may be deposited. The sacrificial layer may include a dielectric material, a semiconductor material, or a conductive material. For example, the sacrificial layer may be single crystalline silicon or polysilicon, which may be deposited by a CVD and/or PVD process. An exemplary material for the sacrificial layer may be polysilicon.

After the sacrificial layer is formed, a layer stack 140 may be formed thereover. The layer stack 140 includes multiple pairs of a first layer 141 and a second layer 142, e.g., the first layer 141 and the second layer 142 are stacked alternately over each other. For example, the layer stack may include 64 pairs, 128 pairs, or more than 128 pairs of the first and second layers 141 and 142.

In some embodiments, the first layer 141 includes a first dielectric material and the second layer 142 includes a second dielectric material that is different from the first dielectric material. The alternating first and second layers 141 and 142 may be deposited via CVD, PVD, ALD, or a combination thereof. Exemplary materials for the first and second layers 141 and 142 include silicon oxide and silicon nitride, respectively. The silicon oxide layer may be used as an isolation layer and the silicon nitride layer may be used as a filler sacrificial layer. The filler sacrificial layer may be subsequently removed and replaced by a conductive material layer or a conductor layer, that includes an electrically conductive material.

Referring to FIG. 2, a staircase structure may be formed based on the layer stack 140 by a staircase formation process. Any suitable etch process, including dry etch and/or wet etch processes, may be used in the staircase formation process. The layer stack 140 may be trimmed by the suitable etch process to form the staircase structure. For example, the height of the staircase structure of the layer stack 140 may increase in a stepwise manner along the Y direction as shown in FIG. 2. A dielectric layer 121 is formed to cover the staircase structure.

Figure 3:
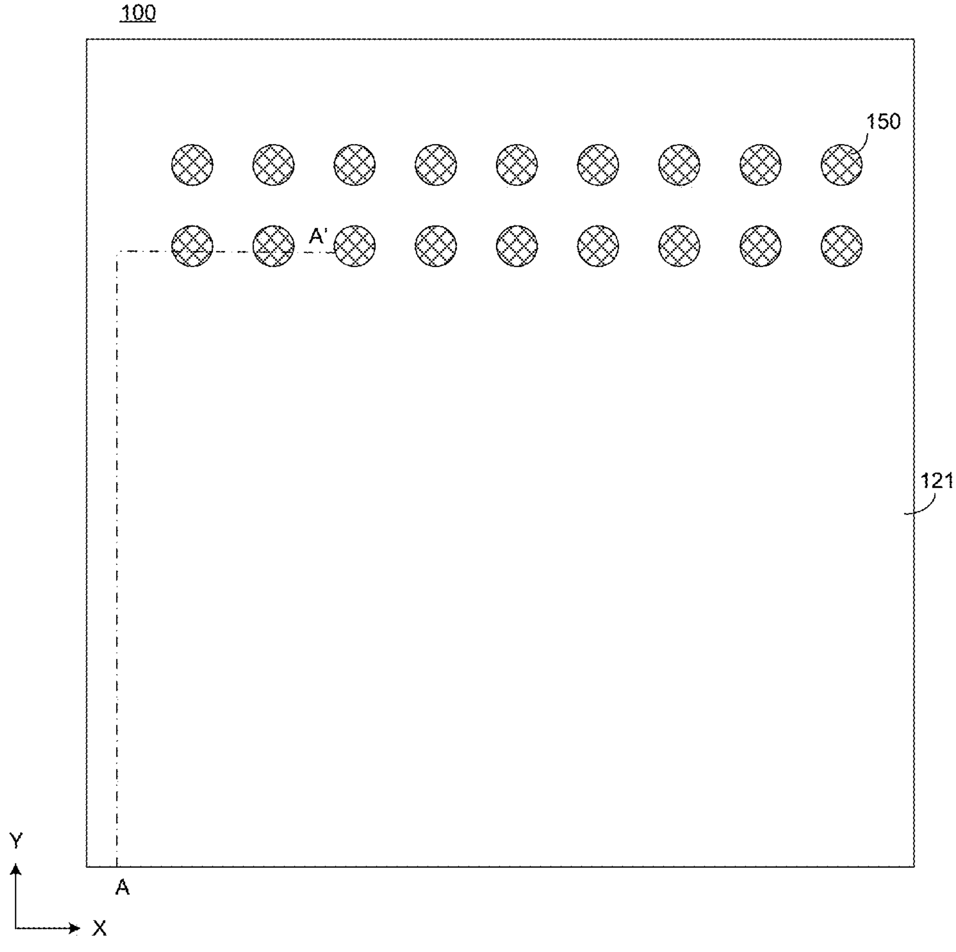
Figure 4:
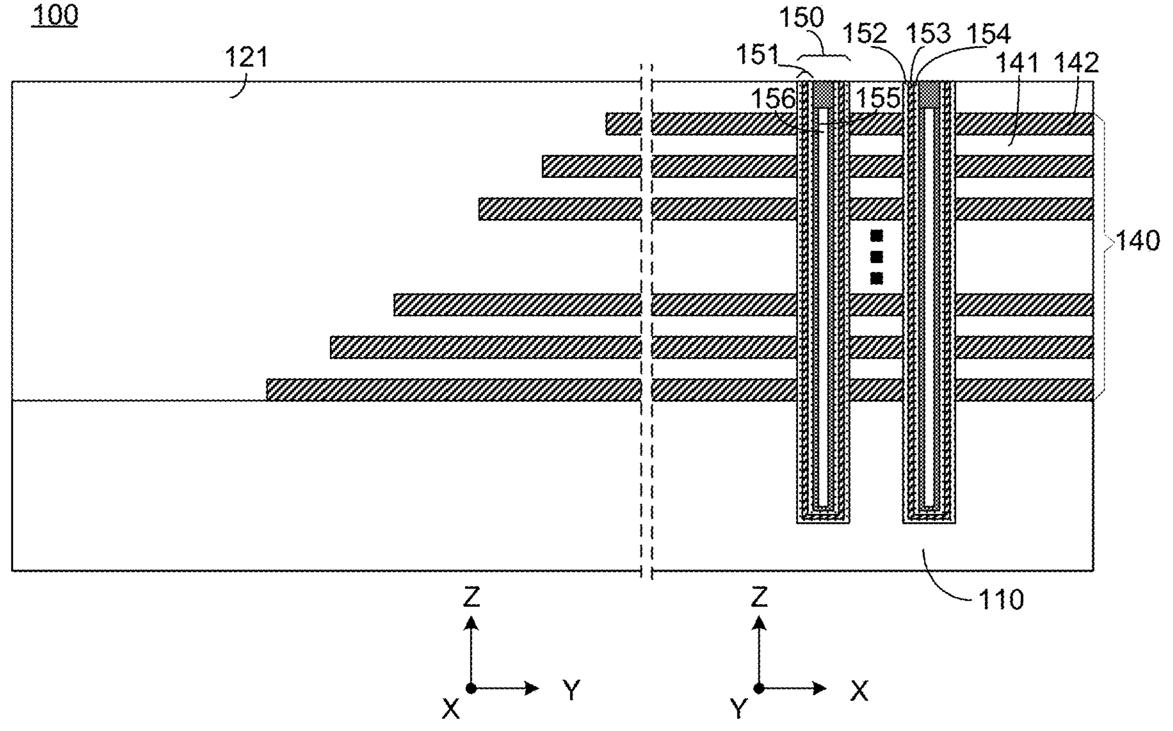

FIGS. 3 and 4 schematically show a top view and a cross-sectional view of the 3D NAND memory device 100 after channel holes 150 are formed and filled with layer structures according to embodiments of the present disclosure. The quantity, dimension, and arrangement of the channel holes 150 shown in FIGS. 3 and 4 and in other figures in the present disclosure are only exemplary and for illustration purposes, although any suitable quantity, dimension, and arrangement may be used for the disclosed device 100 according to various embodiments of the present disclosure.

The channel holes 150 are configured to extend in the Z direction or in a direction approximately perpendicular to the substrate 110 and form an array of a predetermined pattern in the X-Y plane. The cross-sectional view shown in FIG. 4 is taken along an L-shaped line AA' illustrated in FIG. 3.

The channel holes 150 may be formed by, e.g., a dry etch process or a combination of dry and wet etch processes. Other fabrication processes may also be performed, such as a patterning process involving lithography, cleaning, and/or chemical mechanical polishing (CMP). The channel holes 150 may have a cylinder shape or pillar shape that extends through the layer stack 140, the sacrificial layer, the cover layer, and partially penetrates the doped region. After the channel holes 150 are formed, a functional layer 151 may be deposited on the sidewall and bottom of the channel hole. The functional layer 151 may include a blocking layer 152 on the sidewall and bottom of the channel hole to block an outflow of charges, a charge trapping layer 153 on a surface of the blocking layer 152 to store charges during an operation of the 3D NAND memory device 100, and a tunneling dielectric layer 154 on a surface of the charge trapping layer 153. The blocking layer 152 may include one or more layers made of one or more materials. The material for the blocking layer 152 may include silicon oxide, silicon nitride, silicon oxynitride, a high-K dielectric material such as aluminum oxide or hafnium oxide, another wide bandgap material, etc. The charge trapping layer 153 may include one or more layers that may include one or more materials. The materials for the charge trapping layer 153 may include polysilicon, silicon nitride, silicon oxynitride, nanocrystalline silicon, another wide bandgap material, etc. The tunneling dielectric layer 154 may include one or more layers that may include one or more materials. The material for the tunneling dielectric layer 154 may include silicon oxide, silicon nitride, silicon oxynitride, a high-k dielectric material such as aluminum oxide or hafnium oxide, another wide bandgap material, etc.

In some embodiments, the functional layer 151 may include an oxide-nitride-oxide (ONO) structure. In some other embodiments, however, the functional layer 151 may have a structure different from the ONO configuration. In one embodiment, the functional layer 151 may include a silicon oxide layer, a silicon nitride layer, and another silicon oxide layer.

As shown in FIG. 4, the blocking layer 152 may be, e.g., a silicon oxide layer deposited on the sidewall of the channel hole 150. The charge trapping layer 153 may be, e.g., a silicon nitride layer deposited on the blocking layer 152. The tunneling dielectric layer 154 may be, e.g., another silicon oxide layer deposited on the charge trapping layer 153. A channel layer 155 may be, e.g., a "semiconductor channel," such as a polysilicon layer deposited on the tunneling dielectric layer 154. In some other embodiments, the channel layer 155 may include amorphous silicon. Like the channel holes, the channel layers 155 also extend through the layer stack 140 and into the doped region in the substrate. As shown in FIG. 4, a portion of each functional layer 151 is configured between a portion of one of the first and second layers 141 and 142 and a portion of one of the channel layers 155. The blocking layer 152, the charge trapping layer 153, the tunneling dielectric layer 154, and the channel layer 155 may be deposited by, e.g., CVD, PVD, ALD, or a combination of two or more of these processes. In one embodiment, the channel holes 150 may be filled by an oxide material 156 after the channel layers 155 are formed.

In one embodiment, the channel holes 150 may be formed by an etch process after the staircase structure is formed. In another embodiment, the channel holes 150 may be formed before the staircase formation process. For example, after the layer stack 140 is formed as shown in FIG. 1, channel holes 150 may be formed and then the functional layer 151 and the channel layer 155 may be deposited. After the channel holes 150 are filled with the oxide material 156, the staircase formation process may be performed to form the staircase structure as shown in FIG. 4.

In some other embodiments, the disclosed memory device may include multiple layer stacks (e.g., multiple layer stacks 140) that are stacked one over another. For example, after a first layer stack 140 in the staircase form is formed and the channel holes 150 with the functional layers 151 and the channel layers 155 are fabricated, a second layer stack (not shown, e.g., another layer stack 140) in the staircase form may be formed over the first layer stack 140. Channel holes in the second layer stack may be formed and aligned with the channel holes 150 in the first layer stack 140, followed by functional layers and channel layers being deposited in the second layer stack. Each channel layer of the second layer stack may be aligned with and electrically connected to a corresponding channel layer 155 of the first layer stack 140.

In a similar manner, a third or more layer stacks may be formed over the second layer stack. As such, multiple layer stacks may be formed and integrated over the substrate 110 and the memory capacity of the 3D NAND memory device 100 may be multiplied. In the description below, the layer stack 140 is used as an example to illustrate structures and fabrication method of the 3D NAND memory device 100.

Figure 5:
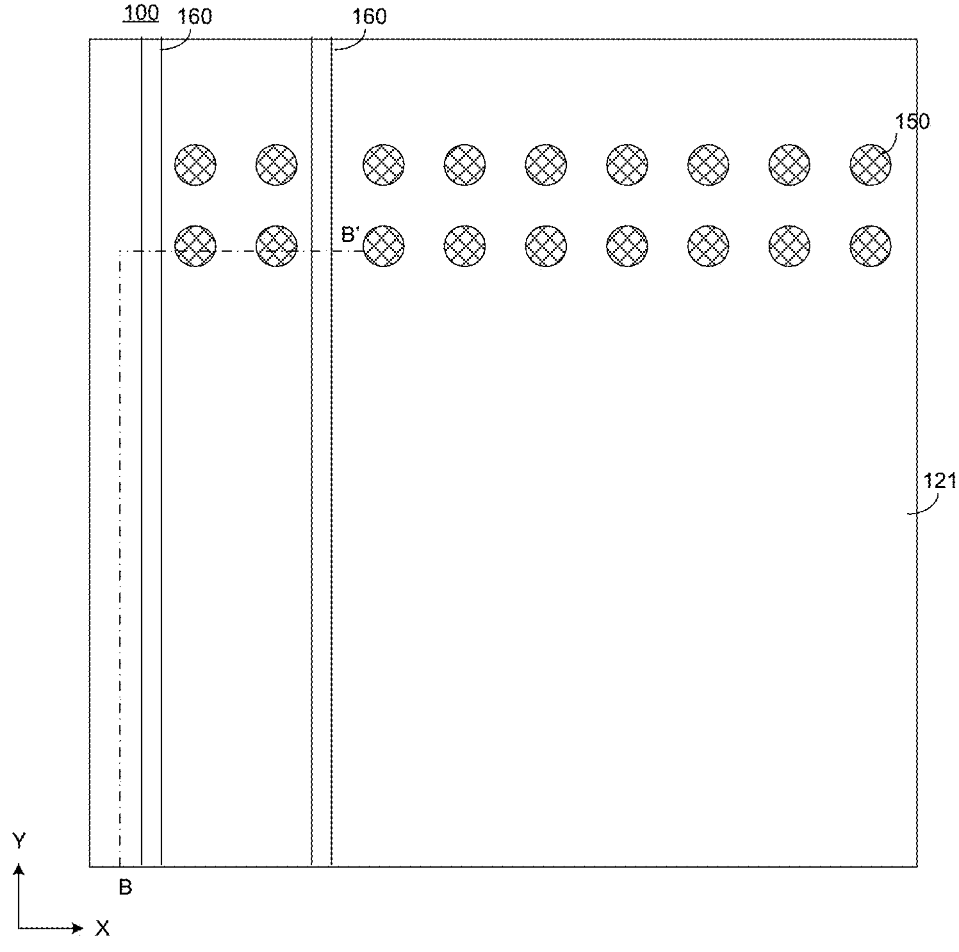
Figure 6:
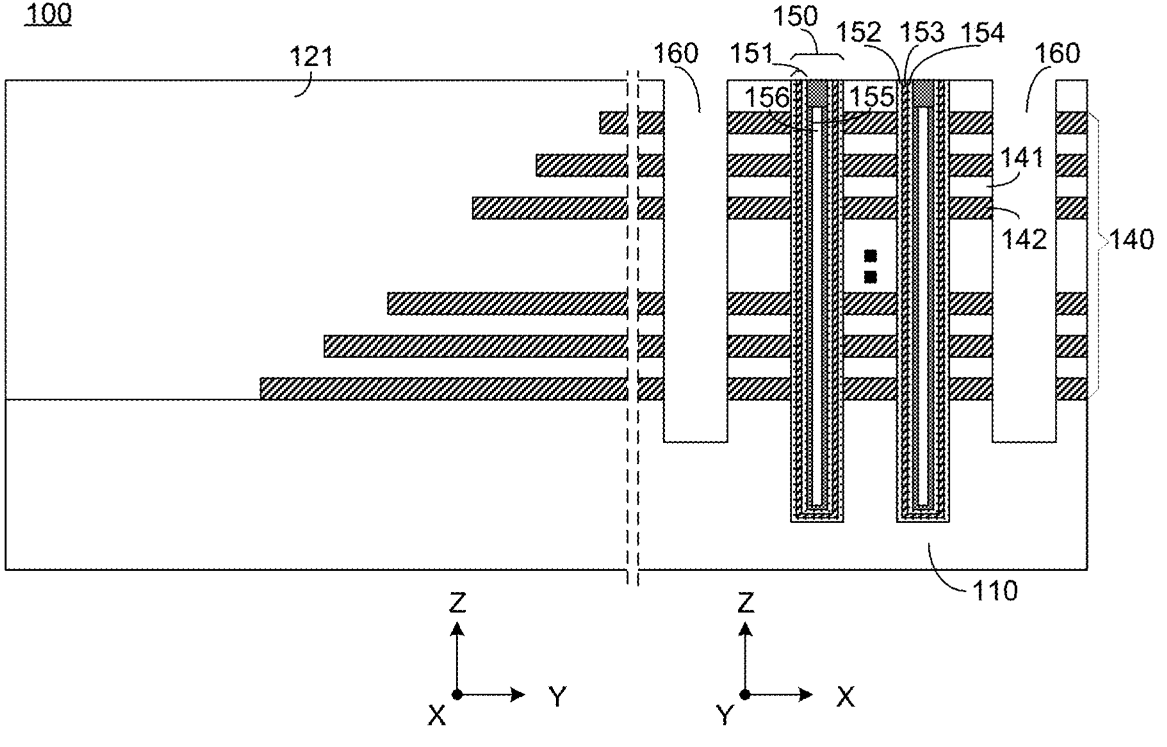

FIGS. 5 and 6 schematically illustrate a top view and a cross-sectional view of the 3D NAND memory device 100 after gate line slit structures 160 (or gate line slits) are formed according to embodiments of the present disclosure. The cross-sectional view shown in FIG. 6 is taken along an L-shaped line BB' of FIG. 5. The 3D NAND memory device 100 may have a great number of NAND memory cells configured in the layer stack 140 or residing in the layer stack 140. The layer stack 140 may be divided into multiple memory blocks. In some embodiments, NAND memory cells belonging to a memory block may be reset together in a block erase operation. The channel holes shown in FIG. 5 may form an exemplary memory block that is separated from other memory block regions (not shown) by the gate line slit structures 160. For example, a pair of the gate line slit structures 160 shown in FIGS. 5 and 6 defines a block there-between. In some other embodiments, one or more additional gate line slit structures may be formed between a pair of the gate line slit structures 160.

The gate line slit structures 160 may be formed by, e.g., a dry etch process or a combination of dry and wet etch processes. As shown in FIG. 6, the gate line slit structures 160 may extend through the layer stack 140 in the Z direction or in a direction approximately perpendicular to the substrate 110.

Then another selective etch process, e.g., a selective wet etch process, may be performed to create a cavity and expose a cover layer (not shown) and bottom portions of the blocking layers 152 formed in the channel holes 150. Next, optionally, multiple selective etch processes, e.g., multiple selective wet etch processes, may be performed to remove the exposed portions of the blocking layer 152, the charge trapping layer 153, and the tunneling dielectric layer 154 consecutively, which exposes bottom side portions of the channel layer 155.

Thus, after the exemplary etch processes described above, the doped region and side portions of the channel layers 155 close to the bottom of the channel hole 150 are exposed in the cavity after removal of the cover layer. The cavity may be filled by a semiconductor material, e.g., polysilicon, to form a semiconductor layer (not shown), e.g., by a CVD and/or PVD deposition process. The semiconductor layer may be n-doped. The semiconductor layer may be formed on the exposed surface of the doped region and on sidewalls or side portions of the channel layers 155, and may be electrically connected to the doped region and the channel layers 155. For example, the substrate 110 may further include the semiconductor layer and/or the doped region at the bottom of the gate line slit structures 160, as shown in FIG. 6.

Figure 7:
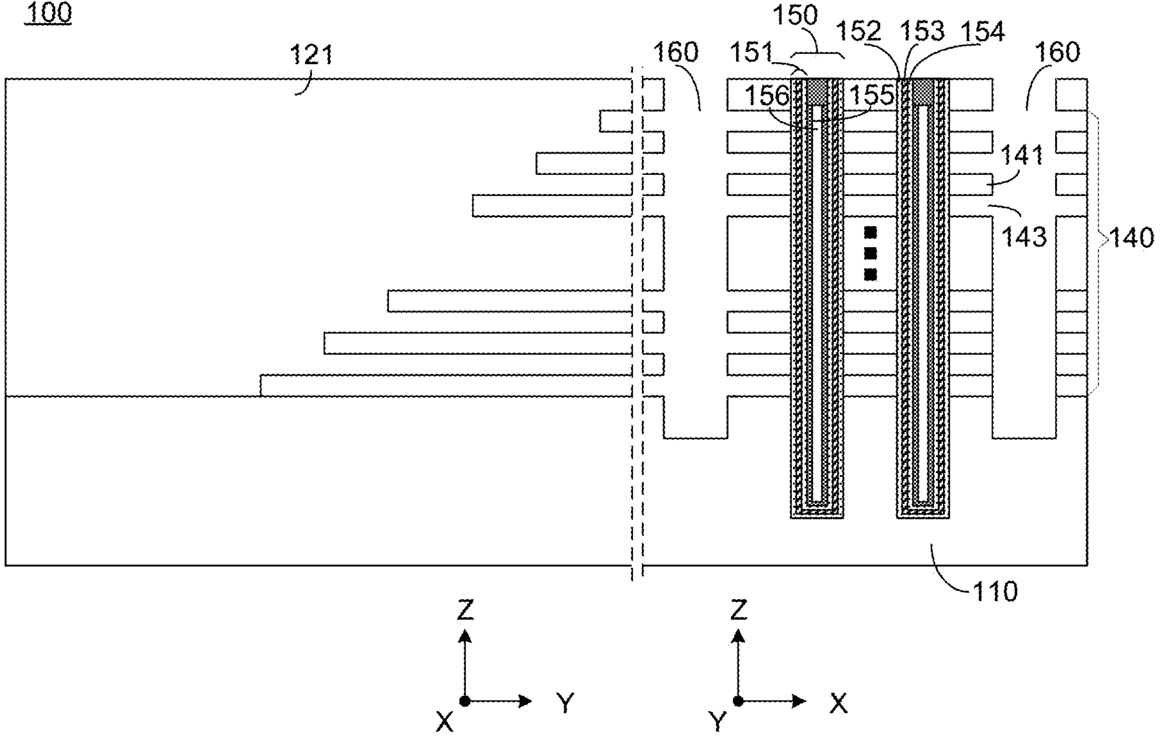
Figure 8:
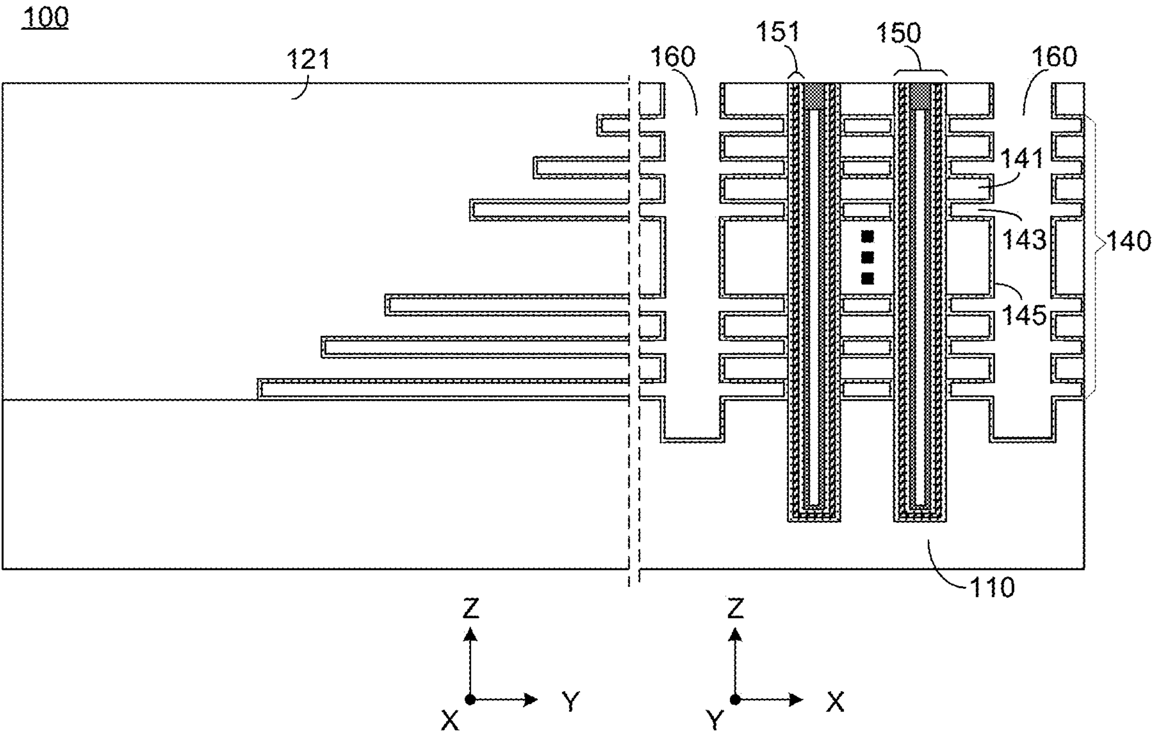
Figure 9:
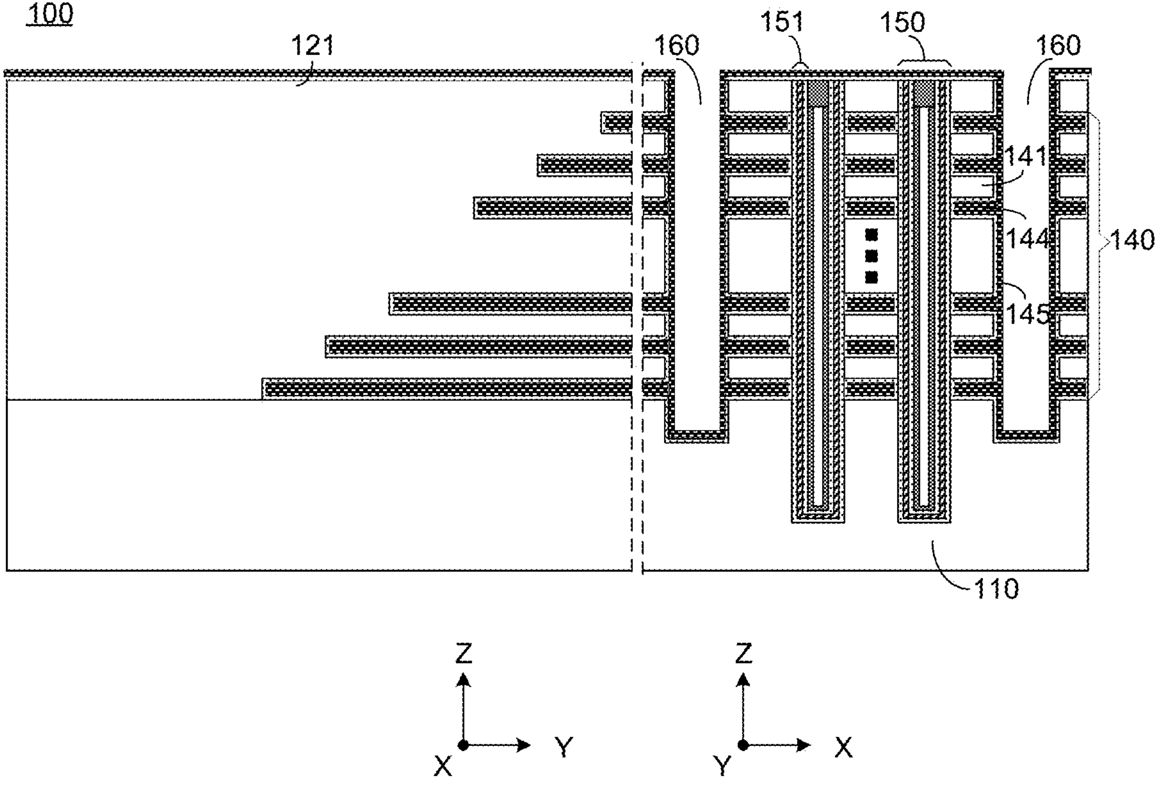

In some embodiments, an electrically conductive material such as tungsten (W) may be grown to fill the cavities 143 (as shown in FIG. 7) formed by the removal of the second layers 142, forming conductive material layers 144 between the first layers 141. That is, the conductive material layers 144 replace the second layers 142 and the layer stack 140 now includes alternating first layers 141 and conductive material layers 144, as shown in FIG. 9. In some embodiments, before metal W is deposited in the cavities 143, a dielectric layer 145 of a high-K dielectric material (i.e., a high-K material layer) such as aluminum oxide may be deposited, as shown in FIG. 8, followed by deposition of a layer of an electrically conductive material such as titanium nitride (not shown). In some embodiments, the material of the high-K material layer 145 includes hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof. Then metal W may be deposited to form the conductive material layers 144. CVD, PVD, ALD, or a combination of two or more of these processes may be used in the deposition processes. In some other embodiments, another conductive material, such as cobalt (Co), copper (Cu), aluminum (Al), doped silicon, or any combination thereof, may be used to form the conductive material layers 144.

A portion of each functional layer 151 in a channel hole 150 is between a portion of one of the conductor layers 144 and a portion of the channel layer 155 in the channel hole 150. Each conductor layer 144 is configured to electrically connect one or more rows of NAND memory cells along the Y direction or in the X-Y plane and is configured as a word line for the 3D NAND memory device 100. The channel layer 155 formed in the channel hole 150 is configured to electrically connect a column or a string of NAND memory cells along the Z direction and configured as a bit line for the 3D NAND memory device 100. As such, a portion of the functional layer 151 in the channel hole 150 in the X-Y plane, as a part of a NAND memory cell, is arranged between a conductor layer 144 and a channel layer 155, i.e., between a word line and a bit line. A portion of the conductor layer 144 that is around a portion of the channel hole 150 functions as a control gate or gate electrode for a NAND memory cell. The 3D NAND memory device 100 depicted in FIG. 9 can be considered as including a 2D array of strings of NAND cells (such a string is also referred to as a "NAND string"). Each NAND string contains multiple NAND memory cells and extends vertically toward the substrate 110. The NAND strings form a 3D array of the NAND memory cells.

After the conductive material layers 144 are formed, the metal W is removed by a first etch process, which includes a dry etch process or a combination of dry and wet etch processes, from the gate line slit structures 160. As shown in FIG. 9, the metal W is supposed to be completely removed from the gate line slit structures 160. In the existing method of fabricating the 3D NAND memory device 100, the metal W may not be completely removed from the sidewall and the bottom of the gate line slit structures 160, and some metal W may remain on the sidewall and the bottom of the gate line slit structures 160, causing leakage currents between adjacent conductor layers 144.

Figure 16:
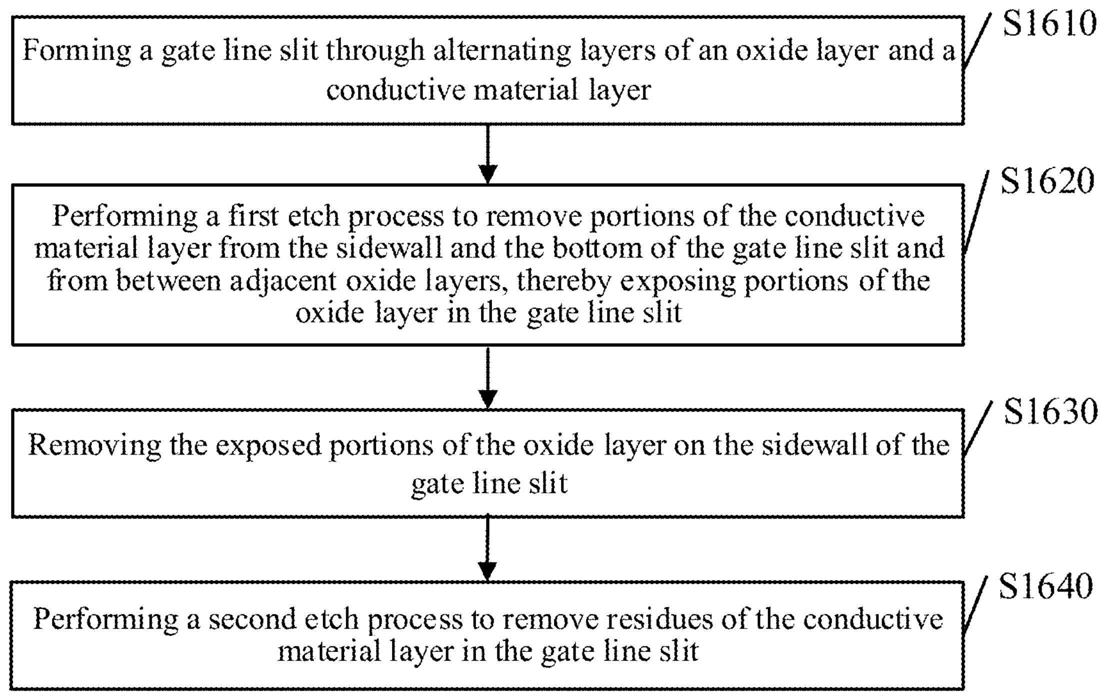
FIG. 16 illustrates a schematic flowchart of an exemplary method of forming a 3D NAND memory device according to embodiments of the present disclosure.

The present disclosure provides a method of forming a gate line slit while removing the metal W or the conductive material layer from the sidewall. FIG. 16 illustrates a schematic flowchart of an exemplary method of forming a gate line slit according to embodiments of the present disclosure. As shown in FIG. 16, the method of forming the gate line slit includes the following processes.

At S1610, a gate line slit is formed through alternating layers of an oxide layer and a conductive material layer.

In some embodiments, referring to FIG. 6, the gate line slit structure 160 is formed in the alternating layers of a first layer 141 and a second layer 142. The first layer 141 includes a first dielectric material. The second layer 142 includes a second dielectric material that is different from the first dielectric material. In some embodiments, the first layer 141 includes silicon oxide, and the second layer 142 includes silicon nitride. In some embodiments, the first layer 141 is an oxide layer, and the second layer 142 is a filler sacrificial layer.

In some embodiments, referring to FIG. 7, the second layer 142 in each pair of the multiple pairs of the first layer 141 and the second layer 142 is removed to form a cavity 143.

In some embodiments, referring to FIG. 8, a dielectric layer 145 of a high-k dielectric material such as aluminum oxide may be deposited, followed by deposition of a layer of an electrically conductive material such as titanium nitride (not shown). The dielectric layer 145 of the high-K material (i.e., the high-K material layer) covers the sidewall and the bottom of the gate line slit structure 160. In some embodiments, the high-K material layer 145 includes an aluminum oxide sub-layer and a titanium nitride sub-layer. Then a conductive material such as tungsten (W) may be deposited to form the conductive material layers 144 as shown in FIG. 9. CVD, PVD, ALD, or a combination of two or more of these processes may be used in the deposition processes. In some other embodiments, another conductive material, such as cobalt (Co), copper (Cu), aluminum (Al), doped silicon, or any combination thereof, may be used to form the conductive material layers 144. The conductive material also covers the dielectric layer 145 on the sidewall and the bottom of the gate line slit structure 160.

Figure 10:
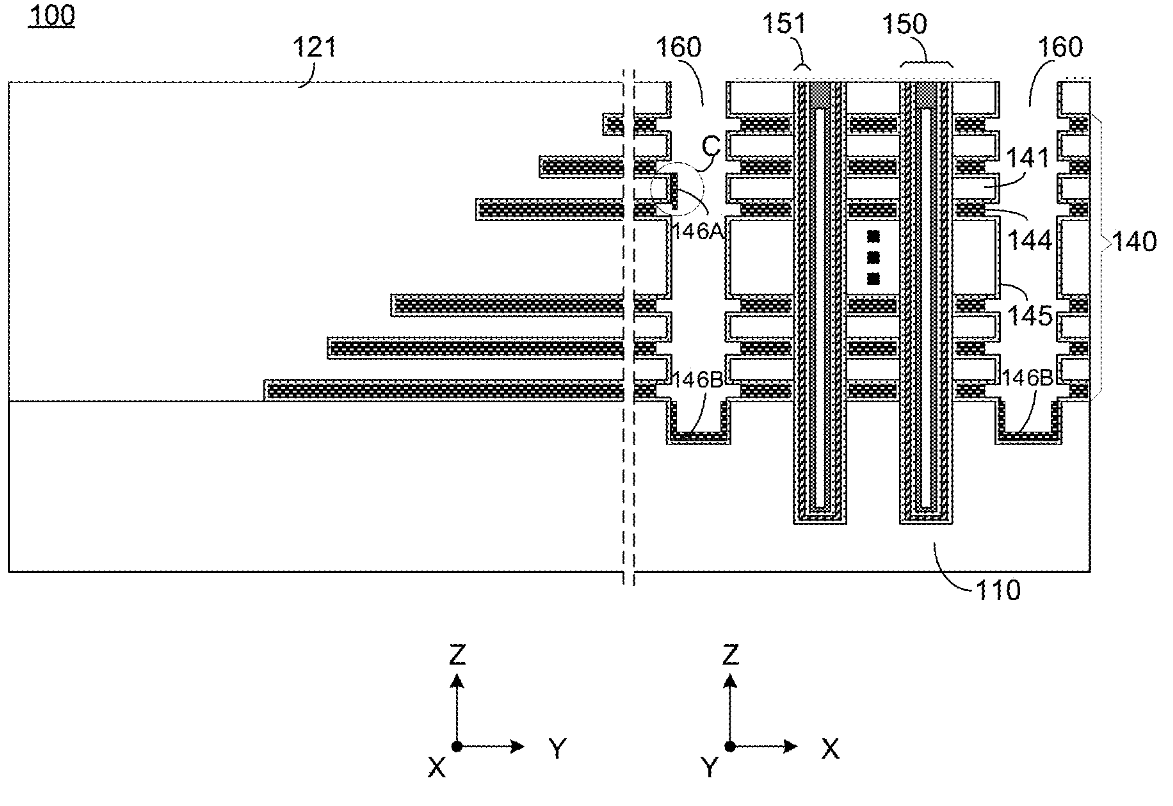
Figure 11:
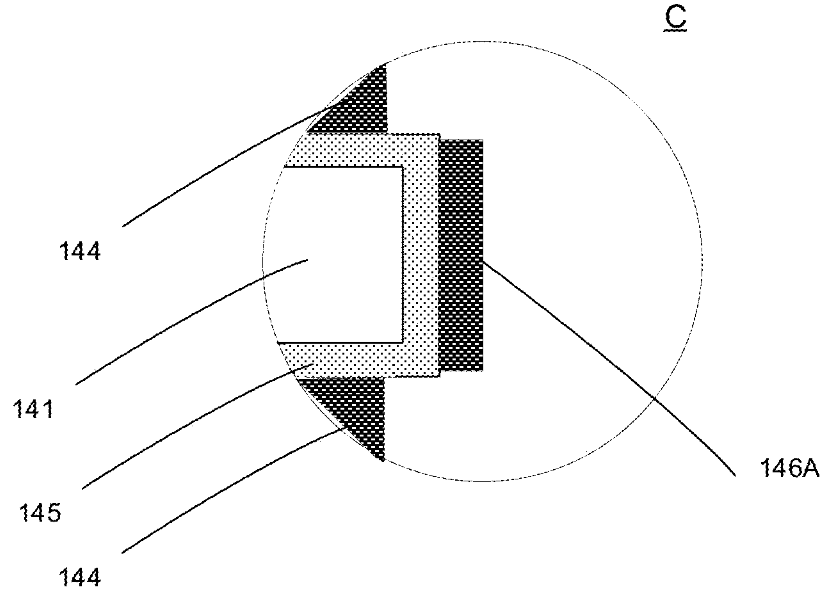

Referring back to FIG. 16, at S1620, a first etch process is performed to remove portions of the conductive material layer from the sidewall and the bottom of the gate line slit and from between adjacent oxide layers, thereby exposing portions of the oxide layer or the high-K material layer. After the first etch process is performed, portions of the conductive material layer may remain on the sidewall (e.g., 146A in FIG. 10) and the bottom (e.g., 146B in FIG. 10) of the gate line slit structure 160. FIG. 11 illustrates a close-up view of a residual of the conductive material layer on the sidewall of the gate line slit as indicated by a circle C in FIG. 10.

In some embodiments, the first etch process is performed to remove the conductive material layer from the sidewall and the bottom of the gate line slit structure 160. As shown in FIG. 10, after the first etch process is performed, the conductive material layer is recessed into the sidewall of the gate line slit structure 160 to expose the portions of the oxide layer 141 (e.g., in FIG. 12) or the high-K material layer 145 (e.g., in FIG. 10).

Figure 12:
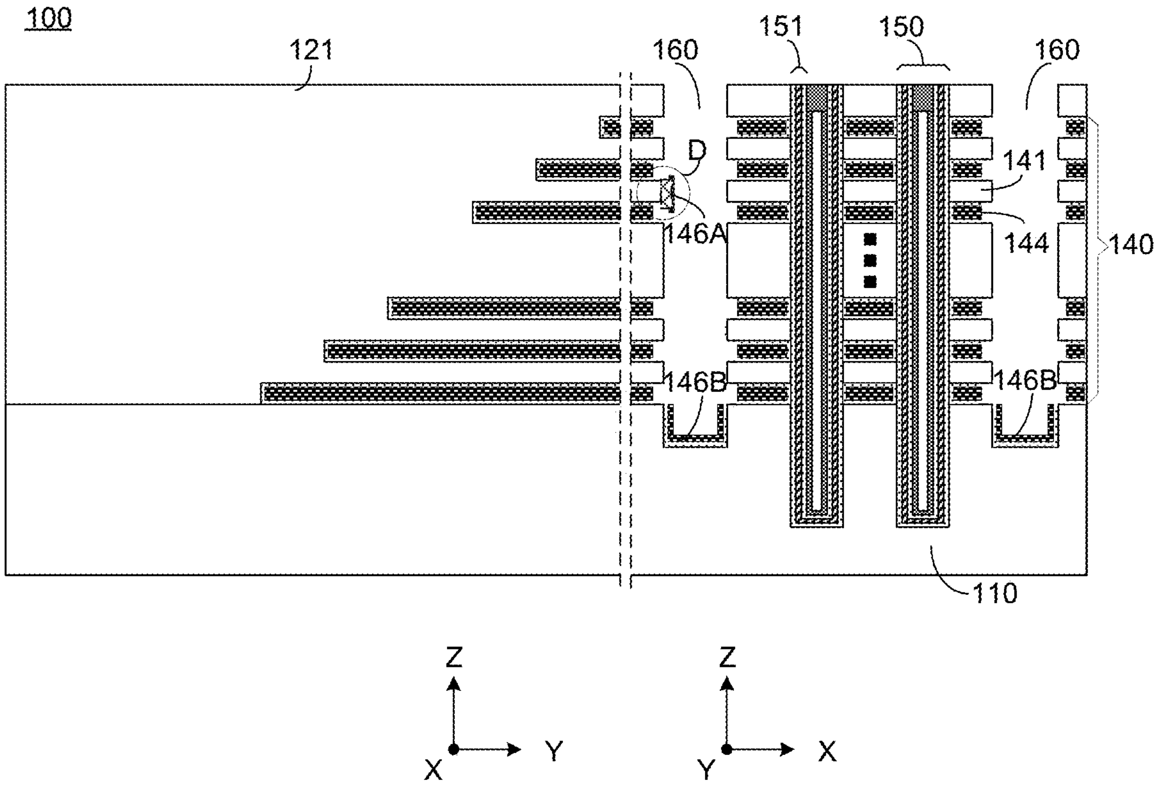

In some embodiments, as shown in FIG. 12, the oxide layer 141 includes a first portion in contact with the high-K material layer disposed between the oxide layer 141 and an adjacent conductive material layer 144 and a second portion in contact with the gate line slit structures.

In some embodiments, as shown in FIG. 10, the exposed portions of the high-K material layer 145 include a first portion of the high-K material layer 145 covering top and bottom surfaces at an end side of the oxide layer 141 and a second portion of the high-K material layer 145 on the sidewall of the gate line slit structure 160. Further, after the first etch process is performed, portions of the conductive material layer may still remain on the sidewall and the bottom of the gate line slit structure 160. This is because the conductive material layer on the sidewall and the bottom of the gate line slit structure 160 has uneven thickness, and the first etch process may be unable to remove thicker portions of the conductive material layer. As shown in FIG. 10, after most conductive material layer is removed from the sidewall and the bottom of the gate line slit structure 160, thicker portions of the conductive material layer 146 remain on the sidewall (e.g., 146A) and the bottom (e.g., 146B) of the gate line slit structure 160. The thicker portions of the conductive material layer 146 need to be removed to avoid leakage currents between adjacent conductor layers 144.

Referring back to FIG. 16, at S1630, the exposed portions of the oxide layer on the sidewall of the gate line slit are removed.

In some embodiments, as shown in FIG. 12, the exposed portions of the oxide layer 141 and the high-K material layer 145 are removed from the sidewall and the bottom of the gate line slit structure 160. In this case, the thicker portions of the conductive material layer 146 still cover portions of the high-K material layer 145 on the sidewall and the bottom of the gate line slit structure 160. The first etch process that removes the exposed portions of the high-K material layer 145 via the gate line slit structure 160 also removes a portion of the high-K material layer 145 located under residues of the conductive material layer, such that the residues of the conductive material layer are likely to be separated from the sidewall and the bottom of the gate line slit structure 160. After the high-K material layer 145 is mostly removed from the sidewall and the bottom of the gate line slit structure 160, some portions of the high-K material layer 145 covered by the thicker portions of the conductive material layer 146 may still remain on the sidewall and the bottom of the gate line slit structure 160.

Figure 13:
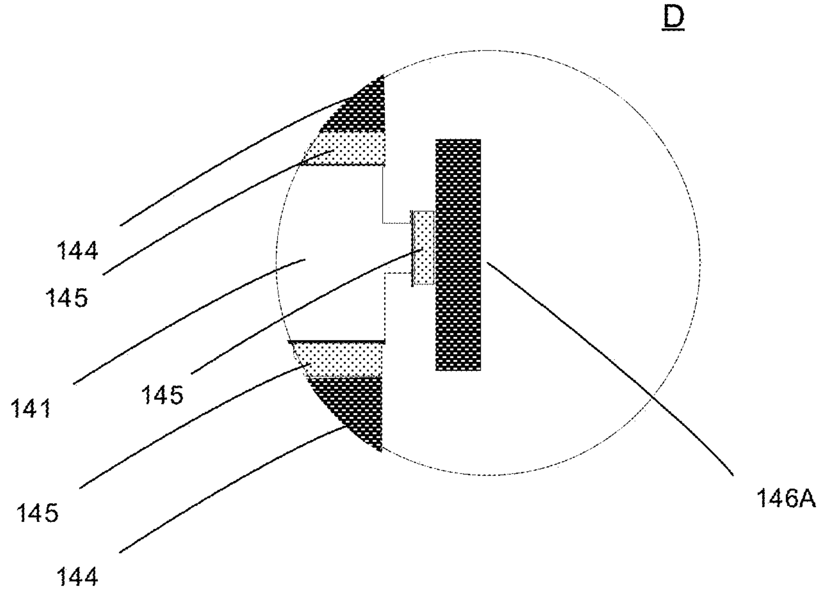

FIG. 13 illustrates a close-up view of a residual of the conductive material layer on the sidewall of the gate line slit as indicated by a circle D in FIG. 12. In some embodiments, as shown in FIG. 13, a portion of each first layer 141 (i.e., each oxide layer) is removed from the sidewall of the gate line slit structure 160. The thicker portions of the conductive material layer 146 cover the remaining portions of the high-K material layer 145 after the high-K material layer 145 is mostly removed. The remaining portions of the high-K material layer 145 are attached to side portions of the first layer 141 on the sidewall of the gate line slit structure 160. In this case, an etch process that removes the portion of each oxide layer via the gate line slit structure 160 also removes a portion of an end side of the oxide layer 141 located under residues of the conductive material layer and also removes a portion of the substrate 110 located at the bottom of the gate line slit structure 160 and under residues of the conductive material layer, such that the residues of the conductive material layer are separated from the sidewall and the bottom of the gate line slit structure 160.

Referring back to FIG. 16, at S1640, a second etch process is performed to remove residues of the conductive material layer in the gate line slit.

Figure 14A:
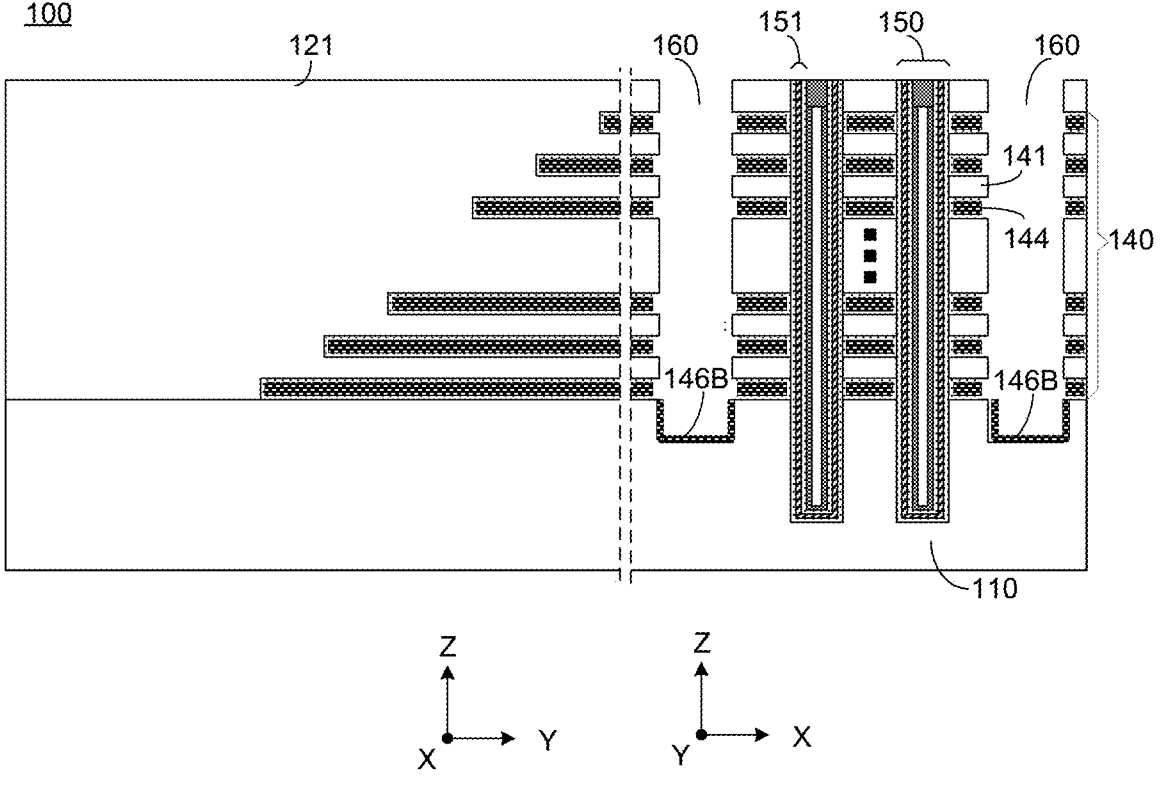

In some embodiments, as shown in FIG. 14A, the second etch process is performed to remove the thicker portions of the conductive material layer 146A from the sidewall of the gate line slit structure 160. At this point, the residues of the conductive material layer, that is, the thicker portions of the conductive material layer 146A are attached to the remaining portions of the high-K material layer 145 that have been substantially shrunk at S1630, and the remaining portions of the high-K material layer 145 are attached to the side portions of the first layer 141 on the sidewall of the gate line slit structure 160, which have also been substantially shrunk at S1630. Thus, the second etch process removes the thicker portions of the conductive material layer 146A from the gate line slit structure 160.

Figure 14B:
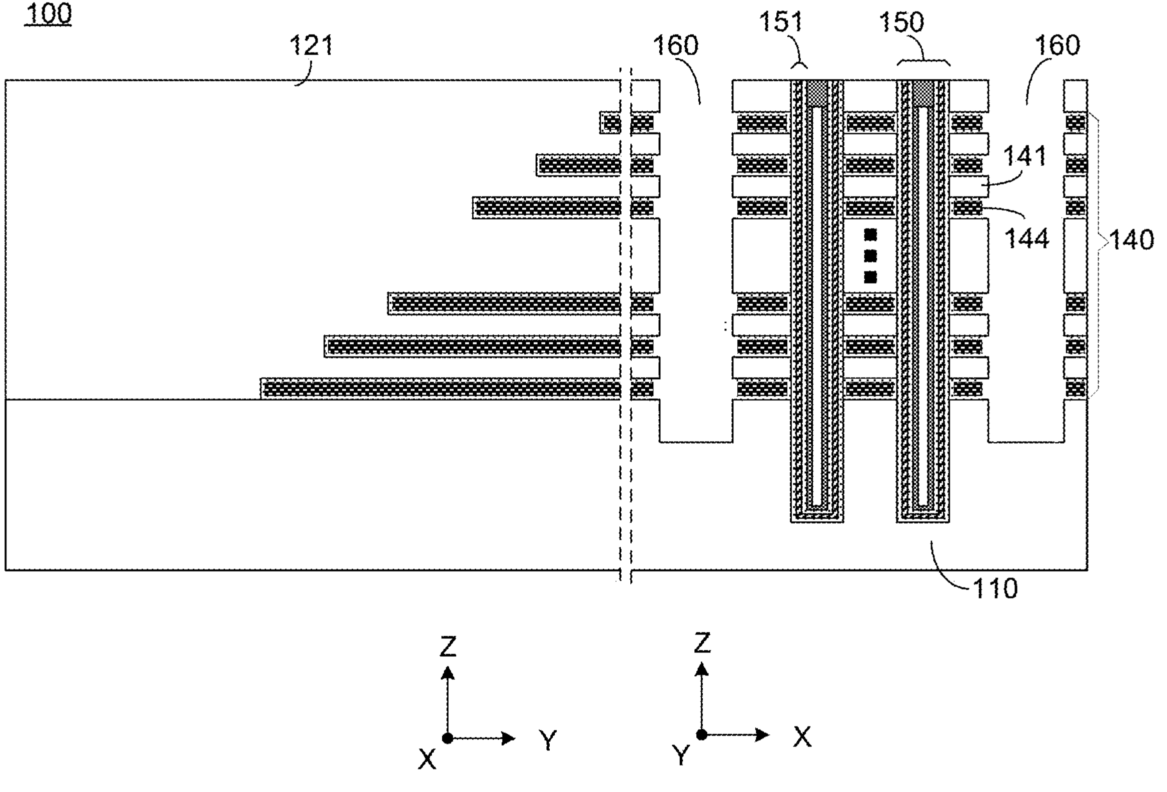

In some embodiments, optionally and additionally, the second etch process further includes an anisotropic sub-process to remove the residues of the conductive material layer 146B from the bottom of the gate line slit structure 160, as shown in FIG. 14B.

In some embodiments, each of the first etch process and the second etch process includes a wet etch process, a dry etch process, or a combination thereof.

In some embodiments, the second etch process is a dry etch process to remove the residues of the conductive material layer in the gate line slit structure 160. Because the dry etch process often etches directionally or anisotropically, the dry etch process removes the residues of the conductive material layer in the gate line slit without removing the conductive material layers 144, thereby avoiding reducing the storage density of the 3D NAND memory device. The dry etch process further removes a side portion of each oxide layer in the gate line slit structure 160.

Figure 15A:
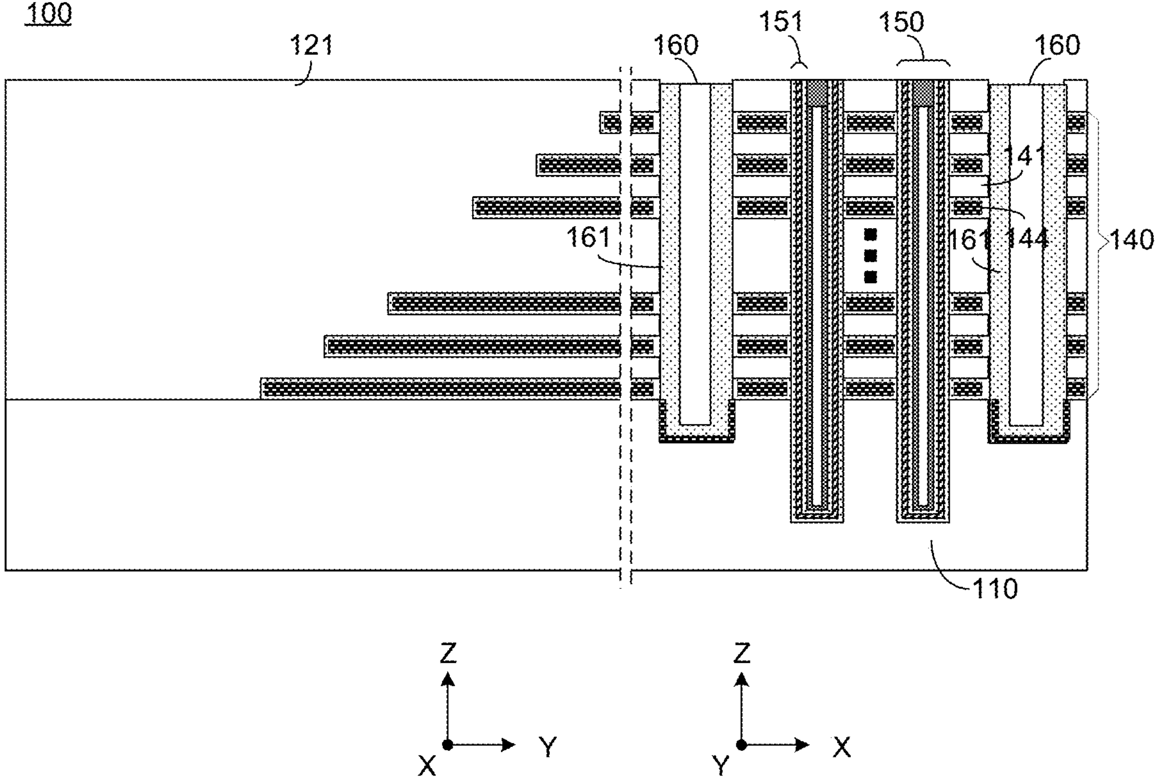
Figure 15B:
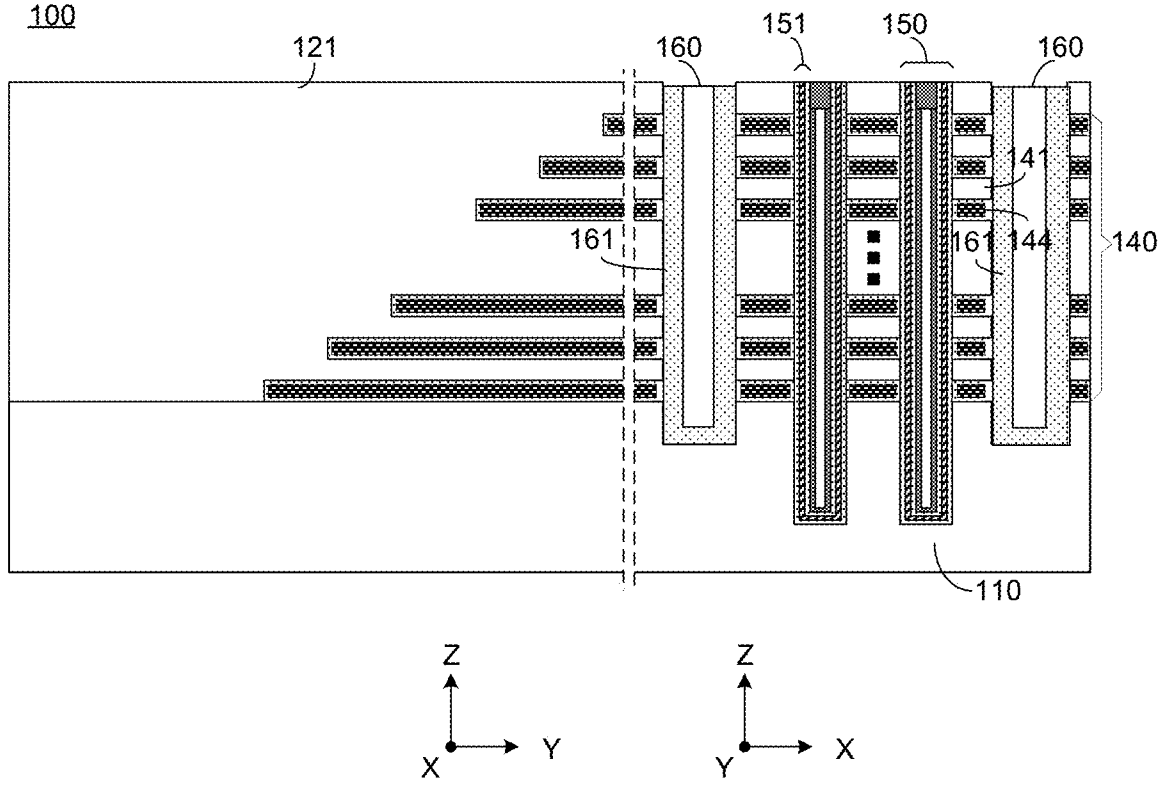

Referring to FIG. 15A and FIG. 15B, a spacer layer 161 is formed on the sidewall and the bottom of the gate line slit structure 160, corresponding to the structures shown in FIG. 14A and FIG. 14B, respectively. The spacer layer is used to protect the alternating layers of the oxide layer and the conductive material layer in the gate line slit structure in subsequent processes.

In some embodiments, the disclosed gate line slit structure 160 includes a cylinder shape. In some other embodiments, the disclosed gate line slit structure 160 includes a frustum shape (not shown). An opening of the frustum-shaped gate line slit structure 160 is wider than the bottom of the gate line slit structure 160 adjacent to the substrate 110.

In embodiments of the present disclosure, the gate line slit structure may be formed while the conductive material layer is removed from the gate line slit. Thus, leakage currents are prevented between adjacent conductive layers.

The present disclosure further provides a 3D NAN memory device. The 3D NAND memory device includes: alternating layers of an oxide layer and a conductive material layer formed on a semiconductor layer; memory cells formed in the alternating layers of the oxide layer and the conductive material layer; and gate line slit structures formed through the alternating layers to separate the memory cells into blocks, where the oxide layer of the alternating layers includes: a first portion in contact with a dielectric material layer disposed between the oxide layer and an adjacent conductive material layer, and a second portion in contact with the gate line slit structures.

In some embodiments, the 3D NAND memory device further includes channel holes formed in the alternating layers, and each channel hole includes a functional layer and a channel layer.

In some embodiments, the dielectric material layer disposed between the oxide layer and the adjacent conductive material layer includes a high-K material layer.

In some embodiments, the dielectric material layer disposed between the oxide layer and the adjacent conductive material layer is a composite layer including a high-k material sub-layer and a TiN material sub-layer.

In some embodiments, sidewall surfaces in the gate line slit structures are free of residuals of the conductive material layer thereon.

In some embodiments, the dielectric material layer is not disposed between the conductive material layer and the gate line structures.

The present disclosure further provides a memory system. The memory system includes a 3D NAND memory device, and a memory controller coupled to the 3D NAND memory device and configured to control operations of the 3D NAND memory device. The 3D NAND memory device includes: alternating layers of an oxide layer and a conductive material layer formed on a semiconductor layer; memory cells formed in the alternating layers of the oxide layer and the conductive material layer; and gate line slit structures formed through the alternating layers to separate the memory cells into blocks, where the oxide layer of the alternating layers includes: a first portion in contact with a dielectric material layer disposed between the oxide layer and an adjacent conductive material layer, and a second portion in contact with the gate line slit structures.

For example, the memory system may be a solid-state drive (SSD) or a universal flash storage (UFS).

In some embodiments, the 3D NAND memory device further includes channel holes formed in the alternating layers, and each channel hole includes a functional layer and a channel layer.

In some embodiments, the dielectric material layer disposed between the oxide layer and the adjacent conductive material layer includes a high-K material layer.

In some embodiments, the dielectric material layer disposed between the oxide layer and the adjacent conductive material layer is a composite layer including a high-k material sub-layer and a TiN material sub-layer.

The foregoing embodiments describe in detail the objective, the technical solution, and the beneficial effect of the present disclosure. The foregoing embodiments are only some of the embodiments of the present disclosure, which should not be used to limit the scope of present disclosure. Therefore, changes, equivalent replacements, and modifications made according to the claims of the present disclosure still fall within the scope of the present disclosure.

What is claimed is:

1. A three-dimensional (3D) NAND memory device, comprising:

alternating layers of an oxide layer and a conductive material layer formed on a semiconductor layer;

memory cells formed in the alternating layers of the oxide layer and the conductive material layer; and a plurality of gate line slit structures formed through the alternating layers to separate the memory cells into blocks, wherein the oxide layer of the alternating layers comprises:

a first portion in contact with a dielectric material layer that is disposed between the oxide layer and an adjacent conductive material layer, and a second portion in contact with a gate line slit structure of the plurality of gate line slit structures, wherein the dielectric material layer and the adjacent conductive material layer each have a sidewall recessed from a sidewall of the second portion of the oxide layer adjacent to the gate line slit structure, and the dielectric material layer disposed between the oxide layer and the adjacent conductive material layer is a composite layer comprising a high-K material sub-layer and a TiN material sub-layer.

2. The 3D NAND memory device according to claim 1, further comprising:

channel holes formed in the alternating layers, each channel hole comprising a functional layer and a channel layer.

3. The 3D NAND memory device according to claim 1, wherein:

the dielectric material layer disposed between the oxide layer and the adjacent conductive material layer comprises a high-K material layer, wherein the high-K material layer includes hafnium oxide, zirconium oxide, hafnium silicon oxide, lanthanum oxide, zirconium silicon, titanium oxide, titanium nitride, tantalum oxide, barium strontium titanium oxide, barium titanium oxide, strontium titanium oxide, aluminum oxide, or a combination thereof.

4. The 3D NAND memory device according to claim 1, wherein:

another conductive material layer is disposed at a bottom and a lower portion of the gate line slit structure and is physically isolated from any conductive material layer of the alternating layers.

5. The 3D NAND memory device according to claim 4, wherein:

a recessed area is formed between adjacent oxide layers of the alternating layers, and on the sidewalls of the dielectric material layer and the adjacent conductive material layer, and the gate line slit structure is further formed into the recessed area.

6. The 3D NAND memory device according to claim 5, further comprising:

a spacer layer on the sidewall of the second portion of the oxide layer, in the recessed area, and on the another conductive material layer at a bottom of the gate line slit structure.

7. The 3D NAND memory device according to claim 4, further comprising:

a spacer layer on the sidewall of the second portion of the oxide layer and on the another conductive material layer at a bottom of the gate line slit structure.

8. The 3D NAND memory device according to claim 1, wherein:

a recessed area is formed between adjacent oxide layers of the alternating layers, and on the sidewalls of the dielectric material layer and the adjacent conductive material layer, and the gate line slit structure is further formed into the recessed area.

9. The 3D NAND memory device according to claim 1, further comprising:

a spacer layer on the sidewall of the second portion of the oxide layer and a bottom of the gate line slit structure.

10. A memory system, comprising:

a three-dimensional (3D) NAND memory device; and a memory controller coupled to the 3D NAND memory device and configured to control operations of the 3D NAND memory device, wherein the 3D NAND memory device includes:

alternating layers of an oxide layer and a conductive material layer formed on a semiconductor layer;

memory cells formed in the alternating layers of the oxide layer and the conductive material layer; and a plurality of gate line slit structures formed through the alternating layers to separate the memory cells into blocks, wherein the oxide layer of the alternating layers comprises:

a first portion in contact with a dielectric material layer that is disposed between the oxide layer and an adjacent conductive material layer, and a second portion in contact with a gate line slit structure of the plurality of gate line slit structures, wherein the dielectric material layer and the adjacent conductive material layer each have a sidewall recessed from a sidewall of the second portion of the oxide layer adjacent to the gate line slit structure, and the dielectric material layer disposed between the oxide layer and the adjacent conductive material layer is a composite layer comprising a high-K material sub-layer and a TiN material sub-layer.

11. The memory system according to claim 10, wherein: the 3D NAND memory device further comprises channel holes formed in the alternating layers, each channel hole comprising a functional layer and a channel layer.

12. The memory system according to claim 10, wherein: another conductive material layer is disposed at a bottom and a lower portion of the gate line slit structure and is physically isolated from any conductive material layer of the alternating layers.

13. The memory system according to claim 12, further comprising:

a spacer layer on the sidewall of the second portion of the oxide layer and on the another conductive material layer at a bottom of the gate line slit structure.

14. The memory system according to claim 13, wherein: the spacer layer is further in a recessed area that is formed between adjacent oxide layers of the alternating layers, and on the sidewalls of the dielectric material layer and the adjacent conductive material layer.

15. The memory system according to claim 10, wherein: a recessed area is formed between adjacent oxide layers of the alternating layers, and on the sidewalls of the dielectric material layer and the adjacent conductive material layer, and the gate line slit structure is further formed into the recessed area.

16. The memory system according to claim 10, further comprising:

a spacer layer on the sidewall of the second portion of the oxide layer and a bottom of the gate line slit structure.

* * * * *